(12) United States Patent
Harada et al.

(10) Patent No.: US 12,529,138 B2
(45) Date of Patent: Jan. 20, 2026

(54) SUBSTRATE PROCESSING APPARATUS, RAW MATERIAL CARTRIDGE, SUBSTRATE PROCESSING METHOD, AND RAW MATERIAL CARTRIDGE MANUFACTURING METHOD

(71) Applicant: Tokyo Electron Limited, Tokyo (JP)

(72) Inventors: Muneo Harada, Osaka (JP); Tsuneyuki Okabe, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 709 days.

(21) Appl. No.: 17/773,998

(22) PCT Filed: Oct. 26, 2020

(86) PCT No.: PCT/JP2020/040118
§ 371 (c)(1),
(2) Date: May 3, 2022

(87) PCT Pub. No.: WO2021/090724
PCT Pub. Date: May 14, 2021

(65) Prior Publication Data
US 2022/0411929 A1    Dec. 29, 2022

(30) Foreign Application Priority Data

Nov. 5, 2019  (JP) ................................. 2019-200872

(51) Int. Cl.
*C23C 16/455* (2006.01)
*C23C 16/30* (2006.01)
(Continued)

(52) U.S. Cl.
CPC ...... *C23C 16/45544* (2013.01); *C23C 16/303* (2013.01); *C23C 16/52* (2013.01);
(Continued)

(58) Field of Classification Search
CPC ...................... C23C 16/4483; C23C 16/45561
See application file for complete search history.

(56) References Cited

U.S. PATENT DOCUMENTS

| | | | |
|---|---|---|---|
| 5,722,184 A | 3/1998 | Onoe et al. | |
| 2002/0110699 A1* | 8/2002 | Yan | C23C 30/00 428/472 |

(Continued)

FOREIGN PATENT DOCUMENTS

| | | |
|---|---|---|
| CN | 107107028 A | 8/2017 |
| JP | 2010-280991 A | 12/2010 |

(Continued)

OTHER PUBLICATIONS

Kresge Nature v359 Oct. 1992 (Year: 1992).*
International Search Report issued on Dec. 28, 2020 for WO 2021/090724 A1 (6 pages).

*Primary Examiner* — Joseph A Miller, Jr.
(74) *Attorney, Agent, or Firm* — Venjuris, P.C.

(57) ABSTRACT

A substrate processing apparatus includes: a chamber; and a processing gas supply unit connected to the chamber via a processing gas supply flow path and configured to supply a processing gas. The processing gas supply unit includes a raw material cartridge that includes a raw material tank that accommodates a porous member containing a metal-organic framework adsorbed with gas molecules of a raw material of the processing gas; a main body configured to communicate the raw material tank and the processing gas supply flow path with each other when the raw material cartridge is attached; and a desorption mechanism configured to desorb the gas molecules of the raw material of the processing gas and allow the gas molecules to flow out as the processing gas to the processing gas supply flow path while the raw material cartridge is attached to the main body.

20 Claims, 7 Drawing Sheets

(51) Int. Cl.
*C23C 16/52* (2006.01)
*H01L 21/02* (2006.01)

(52) U.S. Cl.
CPC .. *H01L 21/02172* (2013.01); *H01L 21/02178* (2013.01); *H01L 21/0228* (2013.01)

(56) References Cited

U.S. PATENT DOCUMENTS

| | | | | |
|---|---|---|---|---|
| 2014/0326428 | A1* | 11/2014 | Meirav | B01D 53/0446 |
| | | | | 165/59 |
| 2015/0176119 | A1 | 6/2015 | Blackwell | |
| 2018/0158687 | A1 | 6/2018 | Han et al. | |
| 2019/0112709 | A1* | 4/2019 | Arkles | C23C 16/45544 |
| 2021/0230191 | A1* | 7/2021 | Mirica | C07F 1/08 |

FOREIGN PATENT DOCUMENTS

| | | |
|---|---|---|
| JP | 5305279 B2 | 10/2013 |
| JP | 2014-198872 A | 11/2014 |
| JP | 5656186 B2 | 1/2015 |
| JP | 2003-282556 A | 6/2015 |
| JP | 2015-215125 A | 12/2015 |
| JP | 2016-191140 A | 11/2016 |
| JP | 2019-048294 A | 3/2019 |
| JP | 2019-507903 A | 3/2019 |

* cited by examiner

SUBSTRATE PROCESSING APPARATUS, RAW MATERIAL CARTRIDGE, SUBSTRATE PROCESSING METHOD, AND RAW MATERIAL CARTRIDGE MANUFACTURING METHOD

CROSS REFERENCE TO RELATED APPLICATIONS

This application is a national phase of PCT application No. PCT/JP2020/040118, filed on 26 Oct. 2020, which claims priority from Japanese patent application No. 2019-200872, filed on 5 Nov. 2019, all of which are incorporated herein by reference.

TECHNICAL FIELD

The present disclosure relates to a substrate processing apparatus, a raw material cartridge, a substrate processing method, and a raw material cartridge manufacturing method.

BACKGROUND

In the semiconductor process of next-generation, a demand for forming a thin film of a metal or a metal compound on a substrate is increasing. The thin film is formed by, for example, an atomic layer deposition (ALD) method or a chemical vapor deposition (CVD) method. The ALD method or CVD method is a method of supplying a raw material gas, which is a processing gas, to a substrate placed in a processing chamber to form a thin film on the substrate. As an example of the method of supplying the raw material gas to the processing chamber, Patent Document 1 proposes that the raw material gas is temporarily stored in a storage unit and then discharged from the storage unit with a boosted pressure into the processing chamber.

Patent Document 2 discloses a porous metal complex having a hydrogen occulusion capacity, which is formed by accumulating a plurality of metal complexes composed of coordinate bonds of aluminum ions and aromatic carboxylic acids. Further, Patent Document 3 describes a porous metal complex having an occulusion capacity of hydrogen, methane, and carbon dioxide, which is formed by accumulating a plurality of metal complexes composed of coordinate bonds of trivalent metal ions and aromatic tricarboxylic acids. Also, Patent Document 4 discloses a configuration in which a gas storage/supply system includes a gas storage tank containing a gas storage material capable of reversibly occuluding and releasing gas such as hydrogen, ammonia, or methane.

PRIOR ART DOCUMENT

Patent Document

Patent Document 1: Japanese Patent Laid-Open Publication No. 2014-198872

Patent Document 2: Japanese Patent No. 5305279

Patent Document 3: Japanese Patent No. 5656186

Patent Document 4: Japanese Patent Laid-Open Publication No. 2015-215125

SUMMARY OF THE INVENTION

Problems to be Solved

The present disclosure provides a technique capable of supplying a high-concentration processing gas to a substrate for manufacturing a semiconductor device when supplying the processing gas for processing the substrate.

Means to Solve the Problems

According to an aspect of the present disclosure, an apparatus is provided to process a substrate for manufacturing a semiconductor device. The apparatus includes: a chamber in which the substrate is accommodated; and a processing gas supply unit connected to the chamber via a processing gas supply flow path and configured to supply a processing gas for processing the substrate. The processing gas supply unit includes: a raw material cartridge including a raw material tank that accommodates a porous member containing a metal-organic framework adsorbed with gas molecules of a raw material of the processing gas; a main body configured to allow the raw material cartridge to be installed thereon and removed therefrom, and the raw material tank and the processing gas supply flow path to communicate with each other when the raw material cartridge is installed; and a desorption mechanism configured to desorb the gas molecules of the raw material of the processing gas adsorbed on the porous member and to perform an operation of allowing the gas molecules to flow out as the processing gas to the processing gas supply flow path while the raw material cartridge is installed on the main body.

Effect of the Invention

The present disclosure may supply a high-concentration processing gas to a substrate for manufacturing a semiconductor device when supplying the processing gas for processing the substrate.

DETAILED DESCRIPTION TO EXECUTE THE INVENTION

A first embodiment of a film forming apparatus, which is an apparatus for processing a substrate of the present disclosure, will be described with reference to FIGS. 1 to 6. The substrate is a substrate for manufacturing a semiconductor device. In this example, descriptions will be made on a film forming apparatus 1 that performs a process of forming a film on a semiconductor wafer (hereinafter, referred to as a "wafer") serving as a substrate. The film forming apparatus 1 includes a chamber 10 accommodating a wafer on which a film is formed, and a gas supply system 11 for supplying a raw material gas, which is a raw material of the film, to the chamber 10. As described above, in the film forming process of the wafer, the processing gas is the raw material gas, and the raw material of the processing gas is the raw material of the film formed on the wafer.

Figure 1:
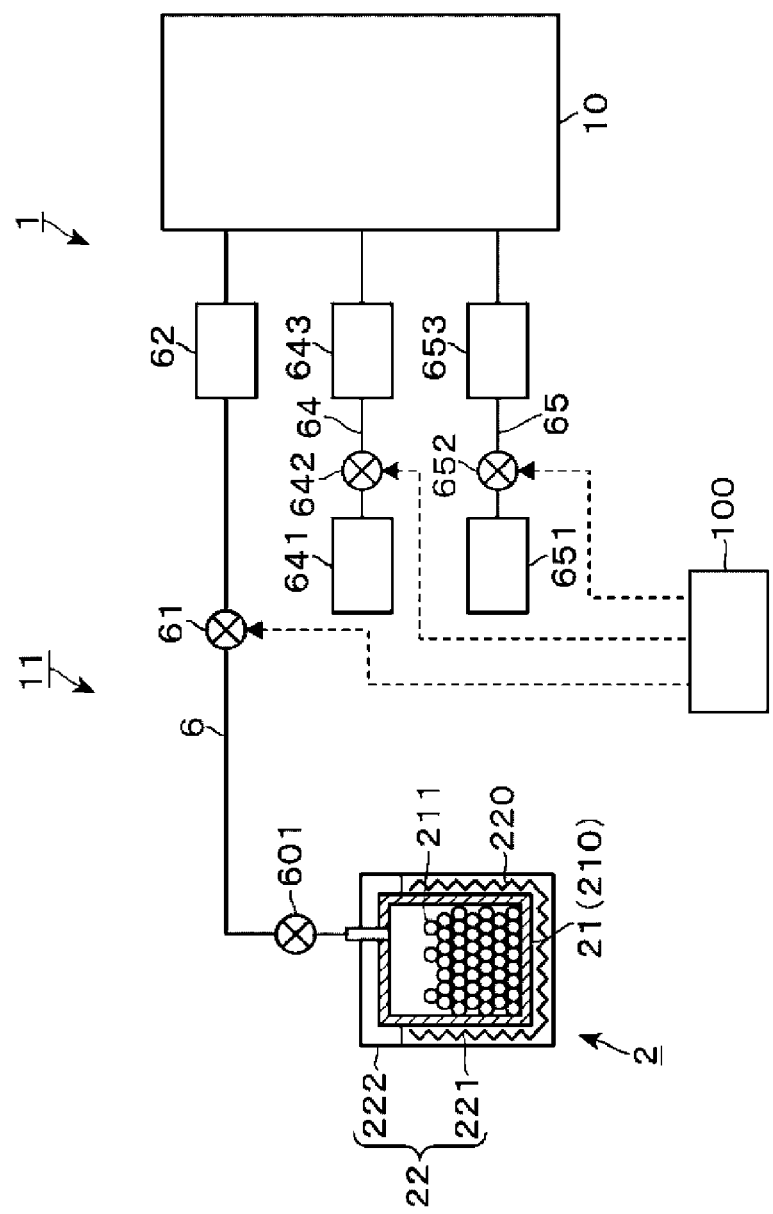
FIG. 1 is a configuration diagram illustrating a film forming apparatus according to an embodiment of the present disclosure.

As illustrated in FIG. 1, the gas supply system 11 includes a raw material gas supply unit 2 for supplying the raw material gas, and the raw material gas supply unit 2 is connected to the chamber 10 via a raw material gas flow path 6. The chamber 10 accommodates a wafer W on which a film is formed, includes, for example, a stage on which the wafer W is placed, and is connected to an exhaust mechanism via an exhaust path. In FIG. 1, the stage, the exhaust path, and the exhaust mechanism are not illustrated. In the present embodiment, the raw material gas supply unit 2 corresponds to a processing gas supply unit, and the raw material gas flow path 6 corresponds to a processing gas supply path.

The raw material gas flow path 6 is a flow path for supplying the raw material gas that has flowed out from the raw material gas supply unit 2 to the chamber 10. The raw material gas flow path 6 includes a raw material gas supply/stop valve 61 configured to supply and stop the supply of the raw material gas to the chamber 10, and a flow rate regulator 62 configured to regulate the flow rate of the raw material gas.

In the gas supply system 11 having the above-described configuration, the raw material gas supply unit 2 includes a raw material cartridge 21 containing a porous member 211 (to be described later) and a main body 22.

Figure 2A:
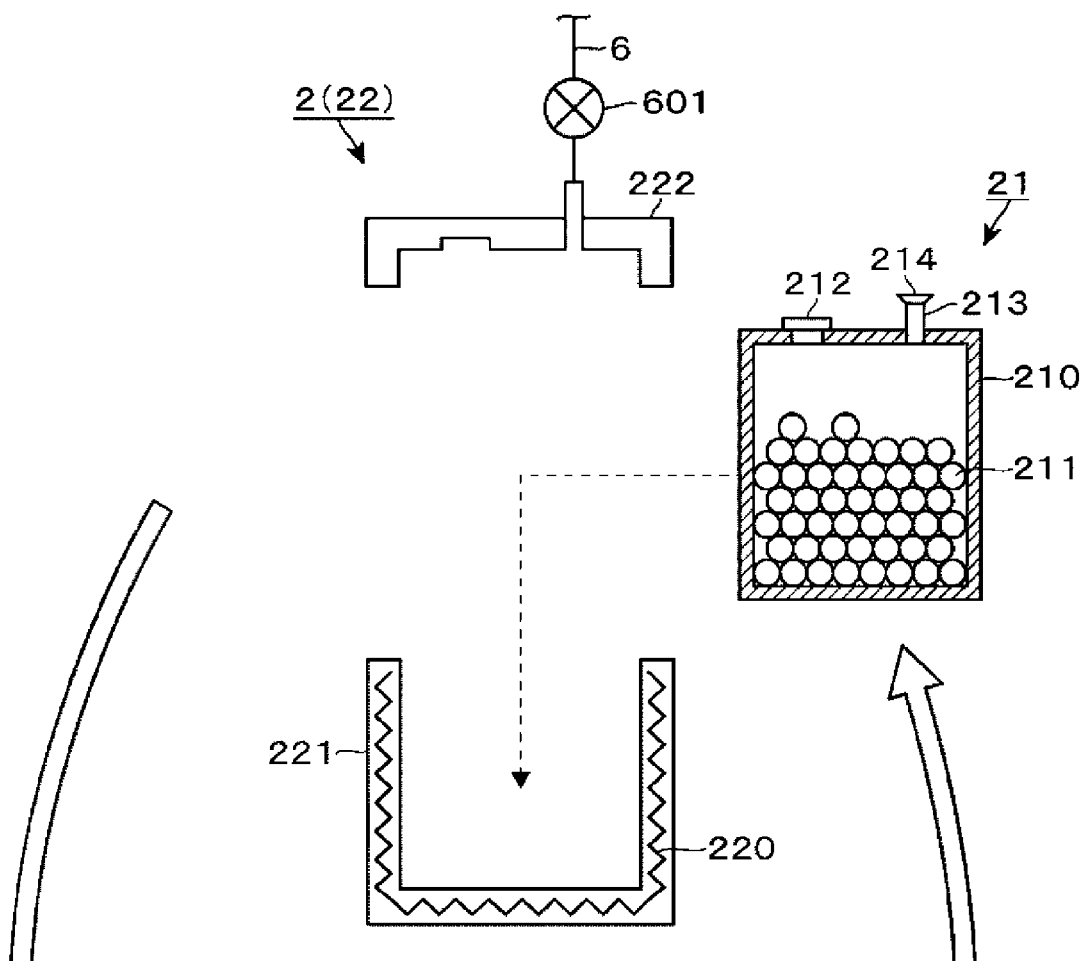
FIGS. 2A and 2B are diagrams illustrating the mounting and manufacturing of a raw material cartridge.

As illustrated in FIG. 2A, the main body 22 includes a container portion 221 which may accommodate the raw material cartridge 21 therein, and a cover portion 222 which is connected to the upstream end of the raw material gas flow path 6 and closes an opening on the upper surface of the container portion 221.

The raw material cartridge 21 includes a raw material tank 210 which is a container accommodating a porous member 211. The raw material tank 210 is composed of, for example, a metal container, and the porous member 211 is accommodated therein. The porous member 211 contains a metal-organic framework (MOF) on which gas molecules of the raw material of the film (molecules of the raw material gas) formed in the chamber 10 are adsorbed.

A metal compound may be used as a raw material of the film. Hereinafter, as an example, descriptions will be made on a case where aluminum chloride ($AlCl_3$), which is a metal halide, is used. Since $AlCl_3$ is a solid at normal temperature and pressure, in the related art, $AlCl_3$ accommodated in a container is vaporized by heating $AlCl_3$ to a temperature at which it does not thermally decompose, for example, 125° C. Then, a method of supplying a carrier gas to the container from the outside and supplying a mixed gas of the raw material gas and the carrier gas toward the chamber 10 has been used. However, in the above-described method, it may be difficult to supply a high-concentration raw material gas because the raw material gas is diluted with the carrier gas.

Therefore, the film forming apparatus 1 of the present disclosure supplies the raw material gas to the metal-organic framework by using the porous member 211 in which the gas molecules of the raw material are adsorbed in advance.

The metal-organic framework contained in the porous member 211 is also referred to as a porous coordination polymer (PCP). The metal-organic framework contains a metal complex composed of a coordinate bond between a metal ion and an organic ligand (organic compound) and has a pore structure formed by accumulating the plurality of metal complexes.

In the metal-organic framework, metal ions are linked by a cross-linkable organic ligand by a coordinate bond between the metal ion and the organic ligand, and a crystalline polymer structure having a space therein is formed. In the metal-organic framework formed by accumulating a plurality of metal complexes, metal ions and organic ligands are regularly bonded with each other. Therefore, as schematically illustrated in, for example, FIGS. 3A and 3B, the metal-organic framework 530 has a structure in which nanometer-sized pores 531 are regularly and three-dimensionally arranged. With respect to such a metal-organic framework 530, the raw material gas is adsorbed so that one or more molecules A of the raw material enter one pore 531 (see FIG. 3A). Although briefly described for convenience of illustration, pores 531 are regularly formed inside the metal-organic framework 530 schematically illustrated in FIGS. 3A and 3B. Then, the molecules A of the raw material may also be adsorbed to the pores 531 inside the metal-organic framework 530.

A solution method, which is one of the methods for manufacturing a metal-organic framework, forms the metal-organic framework by mixing a solution of a metal ion and an organic ligand under normal temperature and pressure, and the accumulation of metal complexes proceeds self-assembling in the solution. As described above, the metal-organic framework is relatively easy to manufacture, and the size and shape of the pores 531 may be controlled by selecting the metal ion and the organic ligand and adjusting synthesis conditions. Thus, the degree of freedom is also high.

In this example, the pores 531 of the metal-organic framework constituting the porous member 211 are designed according to the size of the molecule of $AlCl_3$ so that the molecules of $AlCl_3$ as a raw material are adsorbed.

As the metal-organic framework constituting the porous member 211, an example of using the metal-organic framework selected from the metal-organic framework group described in (a) to (d) below may be mentioned:

(a) a metal-organic framework having a pore structure formed by accumulating a plurality of metal complexes each composed of a coordinate bond between a copper ion and 1,3,5-benzenetricarboxylic acid;

(b) a metal-organic framework having a pore structure formed by accumulating a plurality of metal complexes each composed of a coordinate bond between an iron ion and 1,3,5-benzenetricarboxylic acid;

(c) a metal-organic framework having a pore structure formed by accumulating a plurality of metal complexes each composed of a coordinate bond between a chromium ion and terephthalic acid; and (d) a metal-organic framework having a pore structure formed by accumulating a plurality of metal complexes each composed of a coordinate bond between a lanthanum ion and 1,3,5-tris(4-carboxyphenyl)benzene.

The porous member 211 containing the metal-organic framework is formed into pellets, powder, or granules smaller than the pellets, and is accommodated (filled) in the raw material tank 210. In this way, the filled layer of the porous member 211 is provided in the raw material tank 210. The porous member 211 may be composed only of the metal-organic framework and may include a molding aid for molding the metal-organic framework into pellets or granules in addition to the metal-organic framework.

In the following description, the phrases "pores of the porous member 211" and "adsorption on the porous member 211" may be mentioned without distinguishing the porous member 211 and the metal-organic framework constituting the porous member 211 from each other.

Figure 2B:
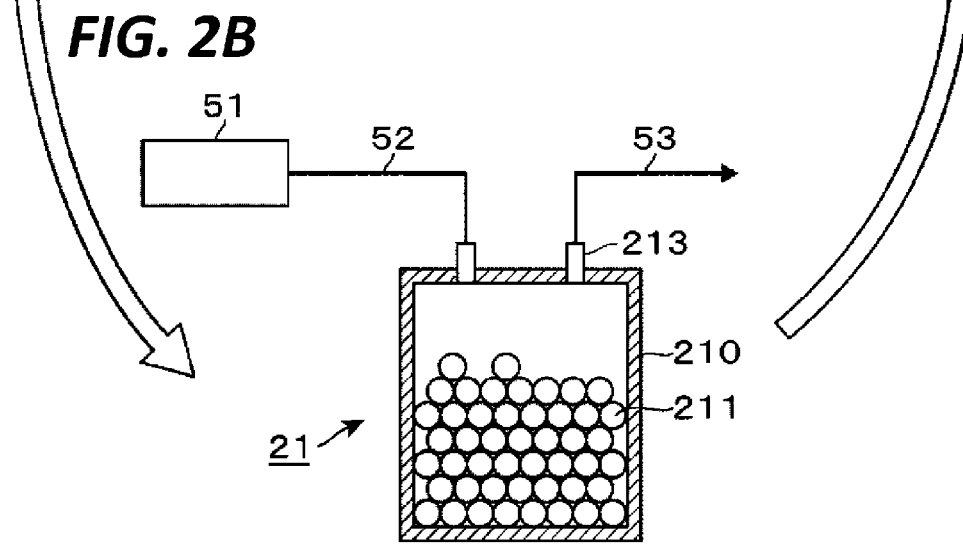

FIG. 2B schematically illustrates a method of manufacturing a raw material cartridge 21 in which the gas molecules of $AlCl_3$ are adsorbed on a metal-organic framework. For example, a raw material gas source 51 includes a container containing a solid raw material of $AlCl_3$, a heating mechanism for vaporizing the raw material, and a carrier gas supply unit that supplies a carrier gas for transporting the raw material gas obtained by heating the raw material to the container. As for the carrier gas, an inert gas such as nitrogen ($N_2$) gas may be used in addition to Ar gas.

When the raw material of a film is a liquid substance at normal temperature and pressure, the raw material gas source 51 may be provided with a bubbling mechanism for vaporizing the raw material by bubbling the carrier gas with the liquid raw material. Further, the mechanism for vaporizing the raw material may be a mechanism that injects a liquid raw material from an injector to directly vaporize the liquid raw material.

The raw material gas source 51 is connected to the raw material tank 210 via a supply flow path 52, and the raw material tank 210 accommodates a porous member 211 containing a metal-organic framework before adsorbing $AlCl_3$. The phrase "before adsorbing $AlCl_3$" may refer to the case where $AlCl_3$ is adsorbed for the first time after the porous member 211 is manufactured. Further, after being used for supplying the raw material gas by the raw material gas supply unit 2, $AlCl_3$ may be adsorbed on the porous member 211 in order to reuse the raw material cartridge 21.

In the manufacture of the raw material cartridge 21, a mixed gas of the raw material gas and the carrier gas is supplied from the raw material gas source 51 having the above-described configuration to the raw material cartridge 21. As described above, since the pores 531 of the metal-organic framework are designed according to the size of the gas molecule of $AlCl_3$, the gas molecule of $AlCl_3$ is preferentially adsorbed. Here, the point that the metal-organic framework preferentially adsorbs the raw material gas contained in the mixed gas means that, for example, when the mixed gas is supplied to the metal-organic framework in a state where the partial pressures of the raw material gas and the carrier gas are equal, the adsorbed amount of molecules of the raw material gas becomes larger than the adsorbed amount of molecules of the carrier gas. In other words, the raw material gas is selectively adsorbed on the metal-organic framework with respect to the carrier gas. Therefore, in addition to the molecules of the raw material gas, the molecules of the carrier gas may be adsorbed on the metal-organic framework.

Further, the raw material to be adsorbed on the metal-organic framework may be a gas at normal temperature and pressure, and a low-concentration raw material gas may be concentrated by preferentially adsorbing on, for example, the metal-organic framework. In this case, the low-concentration raw material gas that needs to be concentrated corresponds to the "raw material of the raw material gas," and it is not necessary to provide a heating mechanism in the raw material gas source 51.

Figure 3A:
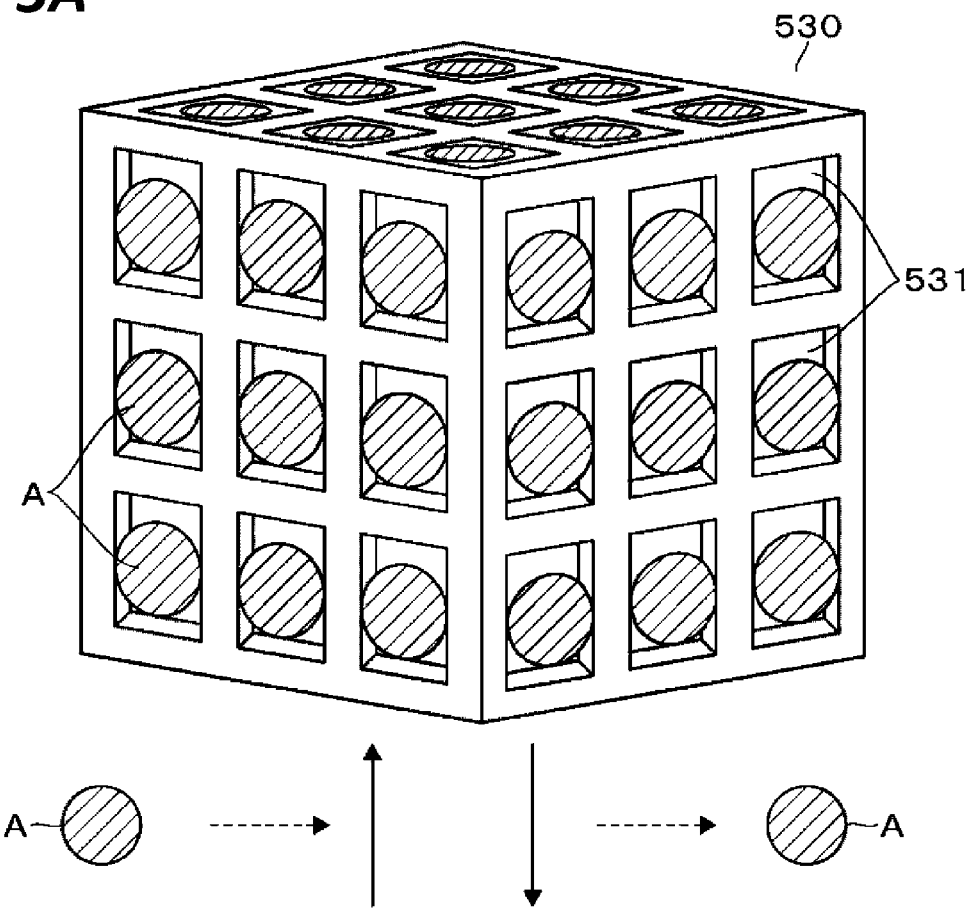
FIGS. 3A and 3B are schematic diagrams illustrating an example of a porous member accommodated in a raw material tank of the film forming apparatus.

When the mixed gas is circulated in the raw material tank 210 filled with the porous member 211 in this way, as illustrated in FIG. 3A, $AlCl_3$ enters the pores 531 of the metal-organic framework 530 constituting the porous member 211 and is adsorbed thereon. As described above, since the pores 531 are nanometer-sized and formed at high density, $AlCl_3$ may be incorporated into each pore 531 to adsorb and store a large amount of raw material gas at high density.

At this time, $AlCl_3$ is in a state of being confined in the pores 531 of the porous member 211 while maintaining the molecular structure of the gas molecule. Meanwhile, as described above, the metal-organic framework is configured to preferentially adsorb the gas molecules of $AlCl_3$ which is a raw material gas. Therefore, the molecules of the carrier gas are not adsorbed on the porous member 211, or are partially adsorbed but most molecules of the carrier gas are not adsorbed and pass through the porous member 211. The carrier gas which is not adsorbed on the metal-organic framework and a part of the raw material gas are discharged to the outside through an exhaust flow path 53 connected to a short pipe portion 213 of the raw material tank 210.

The above-mentioned process for manufacturing the raw material cartridge 21 in which the gas molecules of $AlCl_3$ are adsorbed on the metal-organic framework may be performed by, for example, the manufacturer of the raw material gas, or may be performed by the manufacturer of the film forming apparatus 1.

Further, the user of the film forming apparatus 1 may perform the process at the factory where the film forming apparatus 1 is installed. For example, the case where the raw material gas stored in the raw material cartridge 21 is used up and then the raw material gas is re-stored in the raw material cartridge 21 at the installation location of the raw material gas supply unit 2, is also included in the manufacture of the raw material cartridge 21. In this case, the raw material cartridge 21 may be configured not to be installable or removable while being fixed with respect to the raw material gas supply unit 2.

In the raw material cartridge 21 manufactured by the above-described method, the supply flow path 52 and the exhaust flow path 53 may be removed, and the raw material cartridge 21 may be transferred in a state where the connection positions of the supply flow path 52 and the exhaust flow path 53 are closed by caps 212 and 214.

The raw material cartridge 21 transferred to an installation area of the raw material gas supply unit 2 provided in the film forming apparatus 1 is installed on the main body 22 and used. For installing on the main body 22, for example, after removing the cap 214 from the short pipe portion 213 provided on the upper surface of the raw material tank 210 and connected to the cover portion 222, the raw material tank 210 is accommodated in the container portion 221.

Subsequently, the cover portion 222 is installed on the container portion 221 so that the short pipe portion 213 after removing the cap 214 is inserted into the opening of the cover portion 222 communicating with the raw material gas flow path 6. By the above operation, as illustrated in FIG. 1, the raw material cartridge 21 is installed on the main body 22, and the raw material tank 210 and the raw material gas flow path 6 are in communication with each other.

Here, the main body 22 (container portion 221) of the raw material gas supply unit 2 is provided with a desorption mechanism 220 configured to desorb the raw material gas adsorbed on the porous member 211. The desorption mechanism 220 of this example is a porous member heating mechanism configured to heat the porous member 211 in the raw material tank 210 to perform a desorption operation of desorbing the raw material gas adsorbed on the porous member 211. The porous member heating mechanism is composed of, for example, a heater, and is provided around the raw material tank 210 accommodated in the container portion 221.

Figure 3B:
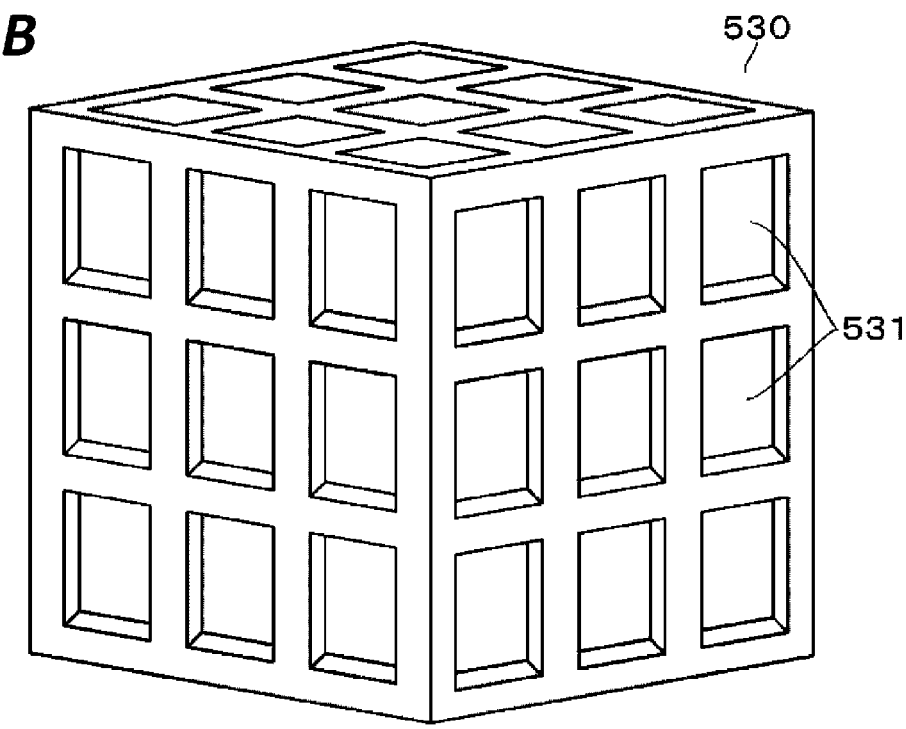

As described above, since the raw material gas is adsorbed to enter the pores 531 of the porous member 211, the adsorption energy of the raw material gas and the porous member 211 is relatively small. Therefore, by heating the porous member 211 at a relatively low temperature at which the raw material gas does not thermally decompose, the raw material gas may be easily desorbed from the metal-organic framework 530 as illustrated in FIG. 3B.

Further, as described with reference to FIG. 2B, even when a mixed gas of the raw material gas and the carrier gas is supplied from the raw material gas source 51 to the porous member 211, the raw material gas is preferentially adsorbed on the porous member 211. Therefore, even when the molecules of the carrier gas adsorbed on the porous member 211 are desorbed by heating, the concentration of the carrier gas in the gas generated by desorption is lower than the concentration of the carrier gas in the mixed gas supplied at the time of manufacturing the raw material cartridge 21. In other words, the porous member 211 may supply the raw material gas at a higher concentration than the mixed gas of the raw material gas and the carrier gas supplied by the method of the related art.

A valve 601 illustrated in FIG. 1 communicates the raw material tank 210 with the raw material gas flow path 6 after installing the raw material cartridge 21. Further, the raw material gas supply/stop valve 61 is configured to perform a supply/stop operation of the raw material gas, and corresponds to the processing gas supply/stop valve of the present embodiment.

Further, the film forming apparatus 1 in this example is configured to form a thin film by the ALD method, and includes a reaction gas supply unit and a purge gas supply unit.

The reaction gas supply unit is configured to supply the reaction gas to the chamber 10, and includes a reaction gas source 641 and a reaction gas supply path 64 for supplying the reaction gas from the reaction gas source 641 to the chamber 10. The reaction gas is a gas that reacts with the raw material gas to form a film, and, for example, ammonia ($NH_3$) gas that produces aluminum nitride (AlN) by reacting with $AlCl_3$ is used. For example, the reaction gas supply path 64 includes a reaction gas supply/stop valve 642 configured to supply and stop the supply of the reaction gas, and a flow rate regulator 643 for regulating the flow rate of the reaction gas.

The purge gas supply unit includes a purge gas supply path 65 for supplying the purge gas from a source 651 of the purge gas, for example, nitrogen ($N_2$) gas to the chamber 10. For example, the purge gas supply path 65 is provided with a purge gas supply/stop valve 652 configured to supply and stop the supply of the purge gas, and a flow rate regulator 653 for regulating the flow rate of the purge gas. In this example, all valves are configured to open and close automatically.

Further, the film forming apparatus 1 includes a control unit 100. The control unit 100 is composed of a computer including a CPU and a storage unit, and controls each unit of the film forming apparatus 1. A program including a group of steps (instructions) for executing an operation required for film forming process of the wafer W is recorded in the storage unit. The program includes a group of steps configured to control the opening and closing operation of the raw material gas supply/stop valve 61, the reaction gas supply/stop valve 642, and the purge gas supply/stop valve 652, for example, so that the raw material gas and the reaction gas are alternately supplied to the chamber 10. The program is stored in a storage medium such as, for example, a hard disk, a compact disk, a magneto-optical disk, or a memory card, and is installed in a computer therefrom.

Figure 4:
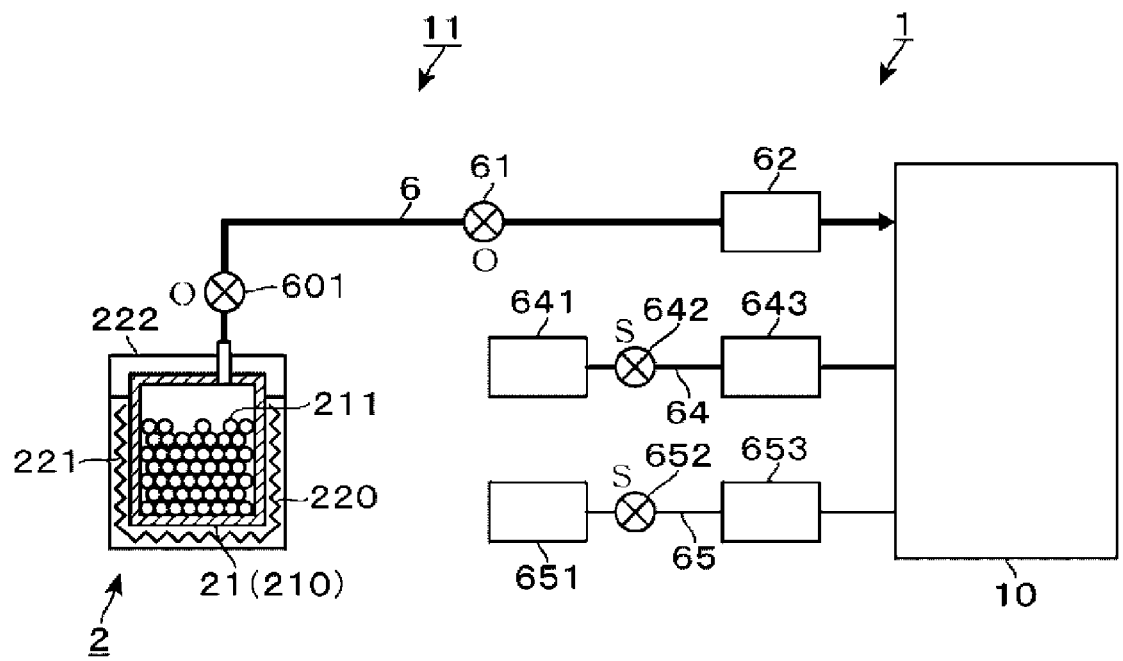
FIG. 4 is a first operation diagram of the film forming apparatus.
Figure 5:
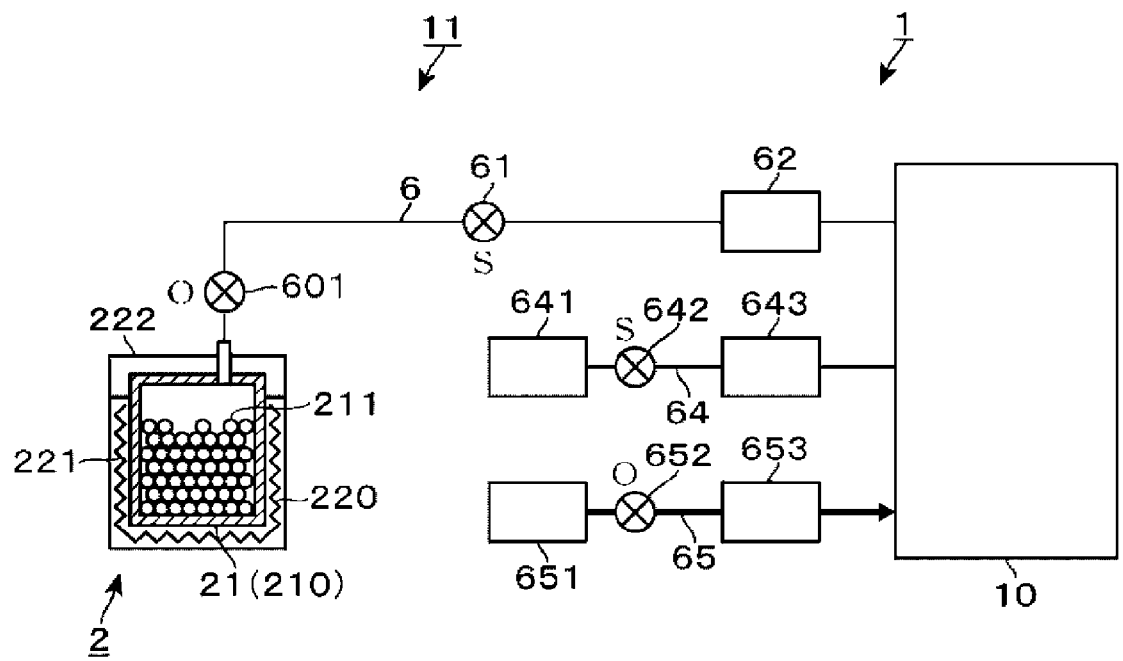
FIG. 5 is a second operation diagram of the film forming apparatus.
Figure 6:
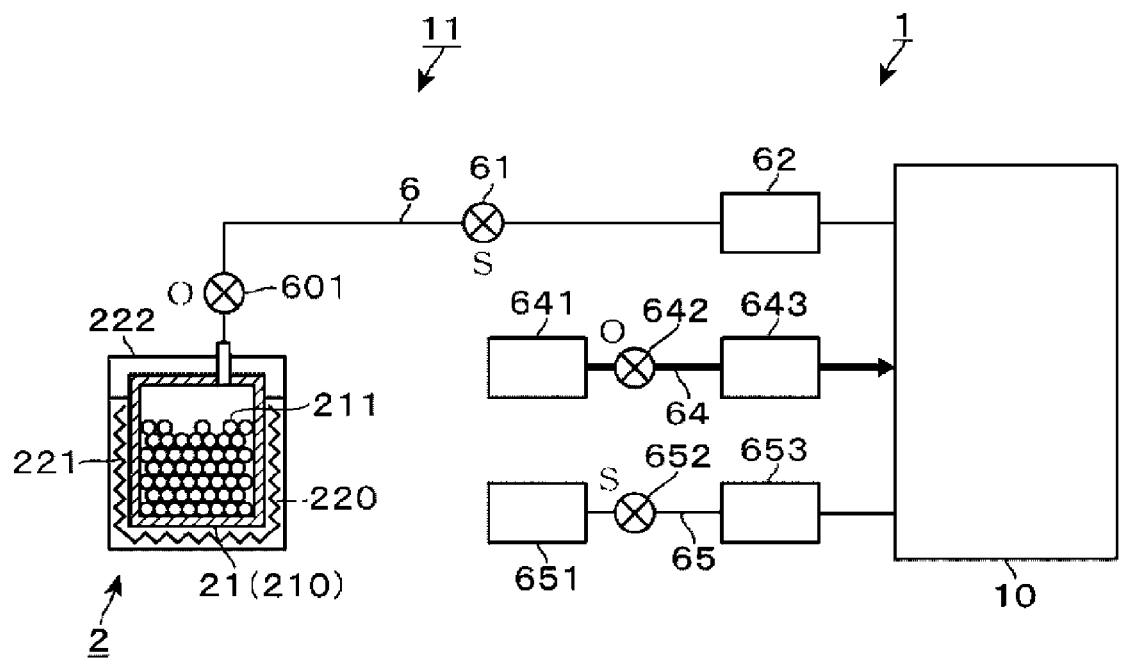
FIG. 6 is a third operation diagram of the film forming apparatus.

Subsequently, descriptions will be made on a method of forming a film on the wafer W, which is performed by the film forming apparatus 1. In FIGS. 4 to 6, a state in which the valve is open is indicated by "0," a state in which the valve is closed is indicated by "5," and the flow path through which the gas flows is indicated by a thick line.

First, as a preparation before forming the film, a step is performed to install the raw material cartridge 21 in which the porous member 211 in the raw material tank 210 is in a state of adsorbing the gas molecules of $AlCl_3$ to the main body 22 of the raw material gas supply unit 2 (see FIG. 2A). The step is performed, for example, in a state where the valve 601 closed. When the raw material cartridge 21 is installed, the valve 601 is opened.

Subsequently, the wafer W is loaded into the chamber 10, the pressure in the chamber 10 is regulated, and the temperature of the wafer W is regulated. Thereafter, the raw material gas supply unit 2 performs an operation of desorbing the gas molecules of $AlCl_3$ adsorbed on the porous member 211 (metal-organic framework) to obtain the raw material gas. That is, the desorption mechanism (porous member heating mechanism) 220 heats the inside of the raw material tank 210 to a temperature at which the raw material gas is desorbed from the porous member 211, thereby desorbing the raw material gas adsorbed on the porous member 211.

After that, the desorbed raw material gas is supplied to the chamber 10 in which the wafer W is accommodated, and a step of forming a film on the wafer W is performed. A wafer W is placed on a stage in the chamber 10, and when a film is formed by the ALD method, the inside of the chamber 10 is first exhausted by an exhaust mechanism to regulate the pressure at the time of film formation. As illustrated in FIG. 4, the raw material gas supply/stop valve 61 is opened, the other valves are closed, and the raw material gas is supplied to the chamber 10 to adsorb the raw material gas on the surface of the wafer W while regulating the flow rate by the flow rate regulator 62.

The desorption of the raw material gas and the supply of the raw material gas to the chamber 10 may be performed at the same time. In this case, as illustrated in FIG. 4, the porous member 211 is heated in a state where the raw material gas supply/stop valve 61 is opened, and the desorbed raw material gas is supplied to the chamber 10 as it is.

Subsequently, the purge gas supply/stop valve 652 is opened, the other valves are closed, the purge gas is supplied to the chamber 10, and the raw material gas in the chamber 10 is replaced with the purge gas (see FIG. 5).

Subsequently, as illustrated in FIG. 6, the reaction gas supply/stop valve 642 is opened, the other valves are closed, and the reaction gas is supplied to the chamber 10. As a result, the raw material gas adsorbed on the surface of the wafer reacts with the reaction gas to form a single molecular layer of AlN. Thereafter, the purge gas supply/stop valve 652 is opened, the other valves are closed, the purge gas is supplied to the chamber 10, and the reaction gas in the chamber 10 is replaced with the purge gas (see FIG. 5).

In this way, the opening/closing operation of the supply/stop valves 61, 642, and 652 of the raw material gas, the reaction gas, and the purge gas is controlled so that the raw material gas and the reaction gas are alternately supplied to the chamber 10 in the order of raw material gas→purge gas→reaction gas→purge gas. Then, by repeating the supply of the raw material gas and the reaction gas, an AlN film having a desired thickness is formed.

In the above, an amount of the porous member 211 accommodated in the raw material tank 210 is set to, for example, an amount capable of adsorbing the raw material gas capable of forming a film on all wafers in one or plural lots in the process of forming a film on the wafer W. Alternatively, the raw material gas may be supplied to the chamber 10 by preparing a plurality of raw material tanks 210 and sequentially switching the raw material tanks 210 connected to the raw material gas flow path 6.

According to the present embodiment, the gas molecules are desorbed from the porous member 211 on which the gas molecules of $AlCl_3$ are selectively adsorbed to obtain the raw material gas. Since the gas molecules of $AlCl_3$ are adsorbed and stored at high density in the porous member 211, the gas desorbed from the porous member 211 is a high-concentration raw material gas having a high content of gas molecules of $AlCl_3$. In this way, the raw material cartridge 21 may selectively adsorb and store a large amount of gas molecules of $AlCl_3$ in the porous member 211 accommodated in the raw material tank 210, and may be desorbed at an arbitrary timing when it is desired to be used. Therefore, the raw material gas may be used without being limited by the vaporization rate of the raw material gas. Further, when forming a film on the wafer W in the chamber 10, a raw material gas having a high concentration of $AlCl_3$ may be supplied to the chamber 10. As a result, it is possible to supply a gas flow rate of the raw material gas sufficient for adsorbing to the wafer W in a short time, which improves the productivity of the film forming process.

Here, it is known that since a raw material which contains a metal such as a metal halide and is a solid or liquid at normal temperature and pressure has a strong interaction between molecules, the raw material has a low saturated vapor pressure and is difficult to vaporize. Meanwhile, when the raw material is heated at a high temperature in order to increase the amount of vaporization, the components of the raw material may be thermally decomposed, and the heating temperature is limited.

Further, in the method of supplying the carrier gas to the raw material gas and circulating the mixed gas of the carrier gas and the raw material gas in the chamber 10, the mixed gas is diluted with the carrier gas, so that it is difficult to increase the concentration of the raw material gas in the mixed gas. Therefore, there is a concern that a sufficient gas flow rate of the raw material gas may not be secured during the film forming process and the productivity may be lowered. In particular, when the raw material gas and the reaction gas are alternately supplied to the chamber 10 by the ALD method to form a film, the film formation rate tends to decrease because a sufficient flow rate of the raw material gas may not be supplied during the supply time of the raw material gas. Therefore, the method of the present disclosure is particularly effective when forming a film by using a raw material having a low saturated vapor pressure and being difficult to vaporize. Although a change occurs according to conditions such as the supply flow rate of the raw material gas and the process pressure in the chamber 10, a case may be suitably exemplified in which a substance having a saturated vapor pressure of 26.7 kPa or less at 100° C. is used as a raw material.

Further, the desorption of the raw material gas from the porous member 211 may be performed by a simple method such as heating the porous member 211 by the porous member heating mechanism constituting the desorption mechanism 220. Therefore, the raw material gas may be efficiently desorbed from the porous member 211 in a short time and without thermally decomposing the molecules of the raw material.

As described above, with respect to the metal-organic framework constituting the porous member 211, it is easier to design the size and shape of the pores 531 than other porous members such as activated carbon and zeolite. Thus, such a metal-organic framework may be designed to selectively adsorb the gas to be adsorbed.

Further, as illustrated in the evaluation test described later, it is confirmed that the porous member 211 containing the metal-organic frameworks, each composed of a coordinate bond of a copper ion and 1,3,5-benzenetricarboxylic acid, a coordinate bond between an iron ion and 1,3,5-benzenetricarboxylic acid, a coordinate bond between a chromium ion and terephthalic acid, or a coordinate bond between a lanthanum ion and 1,3,5-tris(4-carboxyphenyl)benzene may actually adsorb the raw material gas containing $AlCl_3$.

Subsequently, with reference to FIGS. 7 to 9, brief descriptions will be made on a specific configuration example of the film forming apparatus including the gas supply system 11 provided with the raw material gas supply unit 2. In the figures, the same components as those of the film forming apparatus 1 illustrated in FIG. 1 are designated by the same reference numerals, and the descriptions thereof will be omitted.

Figure 7:
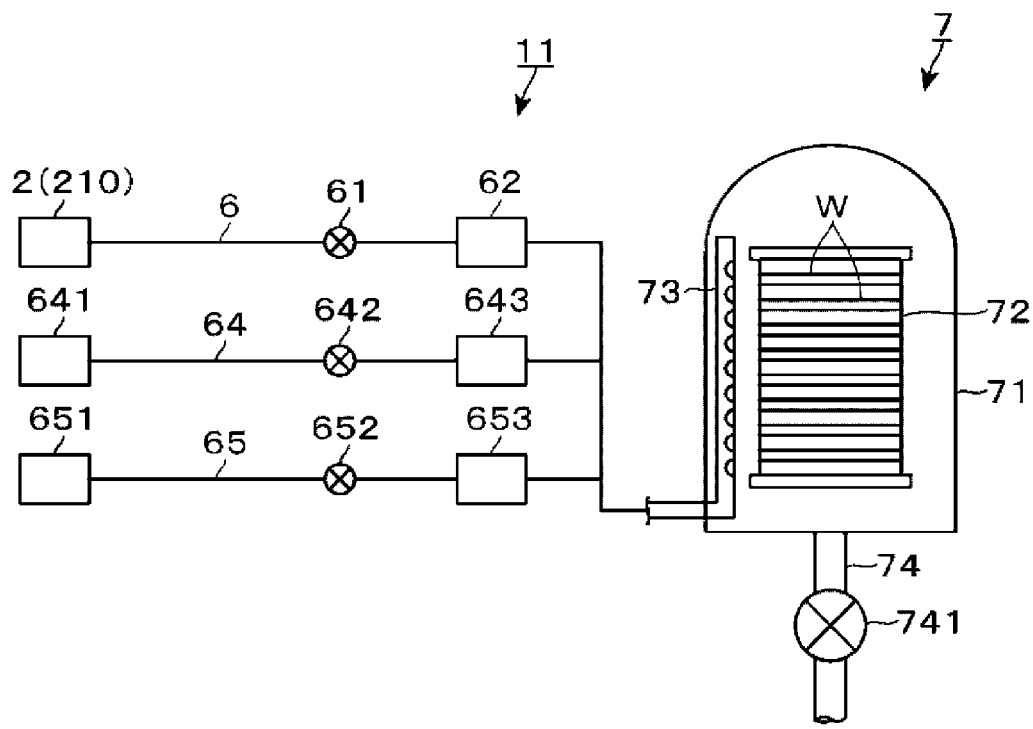
FIG. 7 is a block diagram illustrating a specific example of the film forming apparatus.

FIG. 7 illustrates an example in which a chamber 71 of a batch type film forming apparatus 7 is connected to the gas supply system 11 as the chamber 10 illustrated in FIG. 1. A wafer boat 72 on which wafers W are placed in multiple stages is accommodated in the chamber 71 including a vertically long vacuum container. The chamber 71 is connected to an exhaust mechanism (not illustrated) by an exhaust path 74 provided with a valve 741. Further, when the wafer boat 72 is accommodated in the chamber 71, a gas nozzle 73 is provided on the side of the wafer boat 72 to extend along the longitudinal direction of the wafer boat 72.

The gas nozzle 73 is configured such that the raw material gas is supplied from the raw material tank 210 of the raw material gas supply unit 2 via the gas supply system 11 of the raw material gas of the present disclosure. The gas supply system 11 is configured in the same manner as that illustrated in FIG. 1 in the above-described embodiment. Further, the gas nozzle 73 is connected to the reaction gas source 641 via the reaction gas supply path 64 and to the purge gas source 651 via the purge gas supply path 65. In the film forming apparatus 7, in the same manner as the example described with reference to FIGS. 4 to 6, the raw material gas and the reaction gas are alternately supplied from the gas nozzle 73 into the chamber 71, and a thin film containing, for example, MN is formed on the wafer W by the ALD method.

Figure 8:
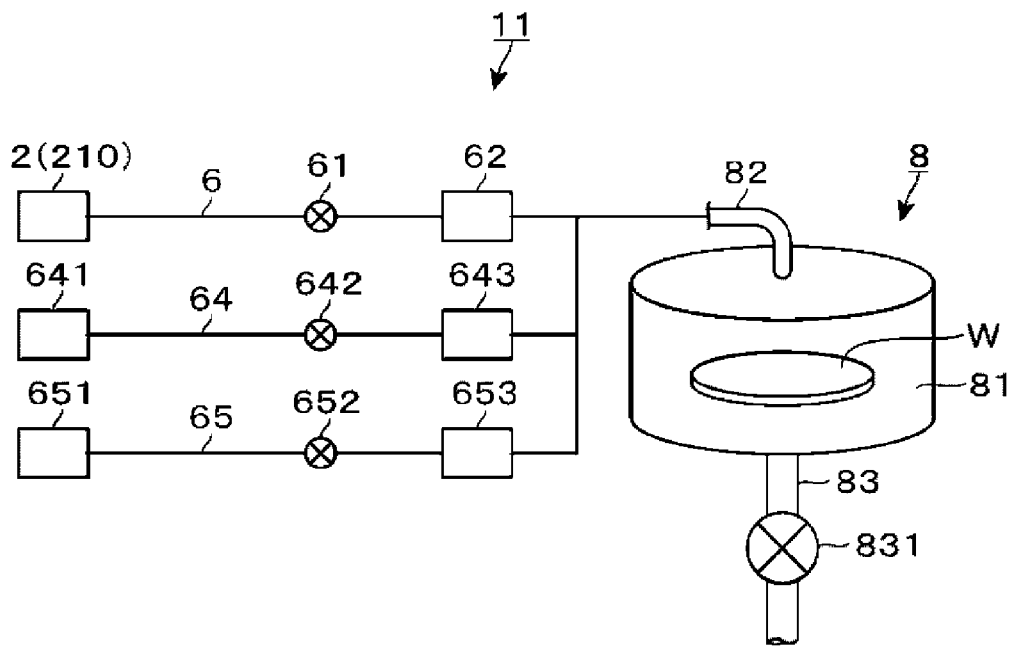
FIG. 8 is a configuration diagram illustrating another specific example of the film forming apparatus.

FIG. 8 illustrates an example in which a chamber 81 of a batch type film forming apparatus 8 is connected to the gas supply system 11 as the chamber 10 illustrated in FIG. 1. A wafer W is placed on a stage (not illustrated) in the chamber 81 containing a flat cylindrical vacuum container. Further, for example, a gas introduction unit 82 is connected to the ceiling of the chamber 81, and the chamber 81 is connected to an exhaust mechanism (not illustrated) by an exhaust path 83 provided with a valve 831.

The gas introduction unit 82 is configured such that the raw material gas is supplied from the raw material tank 210 of the raw material gas supply unit 2 via the gas supply system 11 of the raw material gas of the present disclosure. The gas supply system 11 is configured in the same manner as that illustrated in FIG. 1 in the above-described embodiment. Further, the gas introduction unit 82 is connected to the reaction gas source 641 via the reaction gas supply path 64 and to the purge gas source 651 via the purge gas supply path 65. In the film forming apparatus 8, in the same manner as the example described with reference to FIGS. 4 to 6, the raw material gas and the reaction gas are alternately supplied from the gas introduction unit 82 into the chamber 81, and a thin film containing, for example, MN is formed on the wafer W by the ALD method.

Figure 9:
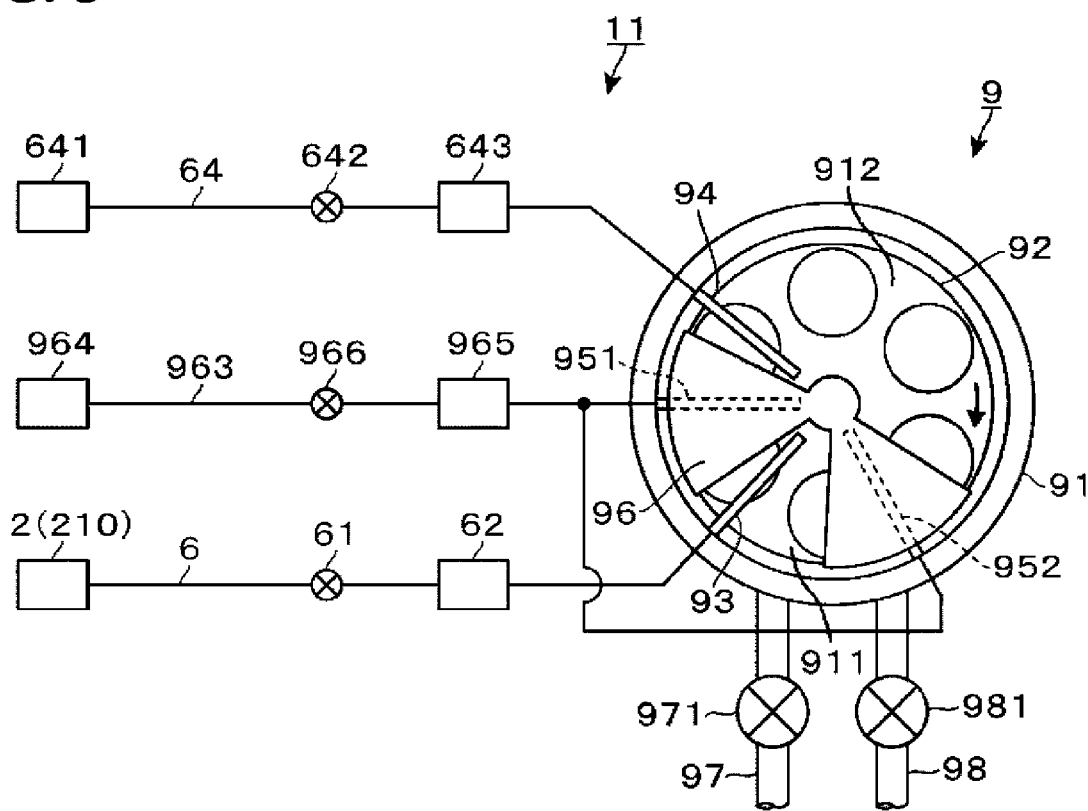
FIG. 9 is a configuration diagram illustrating still another specific example of the film forming apparatus.

FIG. 9 illustrates an example in which a chamber 91 of a semi-batch type film forming apparatus 9 is connected to the gas supply system 11 as the chamber 10 illustrated in FIG. 1. A horizontal rotary table 92 forming a stage is provided in the chamber 91 containing a flat cylindrical vacuum container, and a plurality of wafers W is placed on the rotary table 92 to revolve by the rotation of the rotary table 9. Further, a raw material gas nozzle 93 for supplying the raw material gas and a reaction gas nozzle 94 for supplying the reaction gas are provided in the passing region of the wafer W due to the rotation of the rotary table 92. Two separation gas nozzles 951 and 952 for supplying a separation gas, for example, $N_2$ gas, are provided in the regions between the raw material gas nozzle 93 and the reaction gas nozzle 94, respectively. The raw material gas nozzle 93, the reaction gas nozzle 94, and the separation gas nozzles 951 and 952 are placed to be spaced apart from each other in the circumferential direction and extend horizontally from the side wall of the chamber 91 toward the center thereof.

In the regions where the separation gas nozzles 951 and 952 are provided, for example, a partition member 96 for partitioning the space in the chamber 91 into a supply region 911 to which the raw material gas is supplied and a supply region 912 to which the reaction gas is supplied is provided. As a result, mixing of the raw material gas and the reaction gas is suppressed in the chamber 91. Further, the supply region 911 to which the raw material gas is supplied and the supply region 912 to which the reaction gas is supplied are connected to an exhaust mechanism (not illustrated) via exhaust paths 97 and 98 provided with valves 971 and 981, respectively.

The raw material gas nozzle 93 is configured such that the raw material gas is continuously supplied from the raw material tank 210 of the raw material gas supply unit 2 via the gas supply system 11 of the raw material gas of the present disclosure. The gas supply system 11 is configured in the same manner as that illustrated in FIG. 1 in the above-described embodiment. Further, the reaction gas nozzle 94 is connected to the reaction gas source 641 via the reaction gas supply path 64. The separation gas nozzles 951 and 952 are connected to a source 964 of the separation gas such as the inert gas via the separation gas supply path 963 provided with the separation gas supply/stop valve 966 and the flow rate regulator 965.

In the film forming apparatus 9, the wafer W passes through the supply region 911 of the raw material gas as the rotary table 92 rotates, so that the raw material gas is adsorbed on the surface of the wafer. Subsequently, when the wafer W passes through the supply region 912 of the reaction gas, the raw material gas on the surface of the wafer reacts with the reaction gas to form a film. In this way, the wafer W alternately passes through the supply region 911 of the raw material gas and the supply region 912 of the reaction gas, whereby a thin film containing, for example, MN is formed on the wafer W by the ALD method.

In the gas supply system 11 of the present disclosure described with reference to FIGS. 1 to 9, the desorption mechanism provided in the raw material gas supply unit 2 may be configured by a decompression mechanism configured to perform a desorption operation of depressurizing the inside of the raw material tank 210 and desorbing the raw material gas from the porous member. Further, the desorption mechanism may be provided with both a porous member heating mechanism and a decompression mechanism.

Further, in the examples described with reference to FIGS. 1 to 6, an example has been described in which the high-concentration raw material gas generated in the raw material tank 210 is supplied to the chamber 10 by its own pressure. However, the example does not deny the adoption of a method of transporting the raw material gas using the carrier gas. When a raw material having a sufficient concentration for forming a film on the wafer W is obtained, the carrier gas may be supplied to the raw material tank 210, and the mixed gas of the raw material gas and the carrier gas may be supplied to the chamber 10.

A combination of the raw material gas and the reaction gas is not limited to the above-mentioned example. When a metal halide is used as a raw material, tungsten pentachloride ($WCl_5$) which is solid at room temperature, or titanium tetrachloride ($TiCl_4$) which is liquid at room temperature may be used in addition to $AlCl_3$. For example, when using $WCl_5$ as a raw material and using $NH_3$ gas as a reaction gas to form a film on the wafer W by the ALD method, tungsten nitride (WN) may be formed. Further, for example, when using $TiCl_4$ as a raw material and $NH_3$ gas as a reaction gas to form a film on the wafer W by the ALD method, titanium nitride (TiN) may be formed.

Further, as for the reaction gas that reacts with the raw material gas to form a film, in addition to $NH_3$ gas, oxygen ($O_2$) gas, ozone ($O_3$) gas, hydrogen ($H_2$) gas, water vapor ($H_2O$), and hydrogen peroxide ($H_2O_2$) gas may be used. A tank containing the porous member 211 may be used to supply the reaction gas, if necessary.

The apparatus for forming a film on the substrate is not limited to the film forming apparatus illustrated in FIGS. 7 to 9 mentioned above, and is also applicable to the film forming apparatus having other configurations. Further, the film formation performed on the substrate for manufacturing a semiconductor device may be performed not only by the ALD method but also by the thermal CVD method in which the raw material gas is supplied alone and the film is formed by thermal decomposition. The technique according to the present disclosure is not limited to a film forming apparatus and is applicable to an apparatus for processing a substrate, such as an etching apparatus or an atomic layer etching (ALE) apparatus. In this case, the raw material tank accommodates the porous member 211 adsorbing the gas molecules of the raw material of the etching gas, which is a processing gas for etching the substrate. Further, the substrate to which the present disclosure is applicable is not limited to the semiconductor wafer W. The substrate may be, for example, a glass substrate for flat panel display (FPD).

The embodiments disclosed this time are to be considered in all respects as illustrative and not restrictive. The embodiments described above may be omitted, substituted, or changed in various forms without departing from the scope of the appended claims and the subject matter thereof.

Embodiments

Subsequently, descriptions will be made on an adsorption experiment conducted for evaluating the adsorption of $AlCl_3$ on the metal-organic framework constituting the above-described porous member 211. The experiment was conducted with an apparatus that contains two vials having a volume of 4 ml inside a metal pressure-resistant container having a volume of 90 ml. First, the cover of the vial was opened, 1.0 g of the metal-organic framework (to be described later) was contained in one vial, and 1.0 g of solid $AlCl_3$ was contained in the other vial. Next, in a state where the cover of the vial was opened, the inside of the pressure-resistant container was replaced with Ar gas, which is a carrier gas, and the cover of the pressure-resistant container was closed. Next, the inside of the pressure-resistant container was heated in an oven for 18 hours so that the temperature became about 125° C., and the gas of $AlCl_3$ was adsorbed on the metal-organic framework. After that, the vial containing the metal-organic framework was weighed with an electronic balance, and a thermal gravimetric (TG) analysis was performed.

The adsorption experiment was conducted on the metal-organic frameworks (first to fourth embodiments) described in (a) to (d) below:
(a) a metal-organic framework having a pore structure formed by accumulating a plurality of metal complexes each composed of a coordinate bond between a copper ion and 1,3,5-benzenetricarboxylic acid (first embodiment);
(b) a metal-organic framework having a pore structure formed by accumulating a plurality of metal complexes each composed of a coordinate bond between a copper ion and 1,3,5-benzenetricarboxylic acid (second embodiment);
(c) a metal-organic framework having a pore structure formed by accumulating a plurality of metal complexes each composed of a coordinate bond between a chromium ion and terephthalic acid (third embodiment); and
(d) a metal-organic framework having a pore structure formed by accumulating a plurality of metal complexes each composed of a coordinate bond between a lanthanum ion and 1,3,5-tris(4-carboxyphenyl)benzene (fourth embodiment).

In addition, as a comparative example of the adsorption experiment, the TG analysis of $AlCl_3$ alone was also performed. In the comparative experiment, one vial was provided inside the pressure-resistant container, and the same amount of solid $AlCl_3$ was contained in the vial, and the TG analysis was performed in the same manner as in the above-mentioned adsorption experiment.

Figure 10:
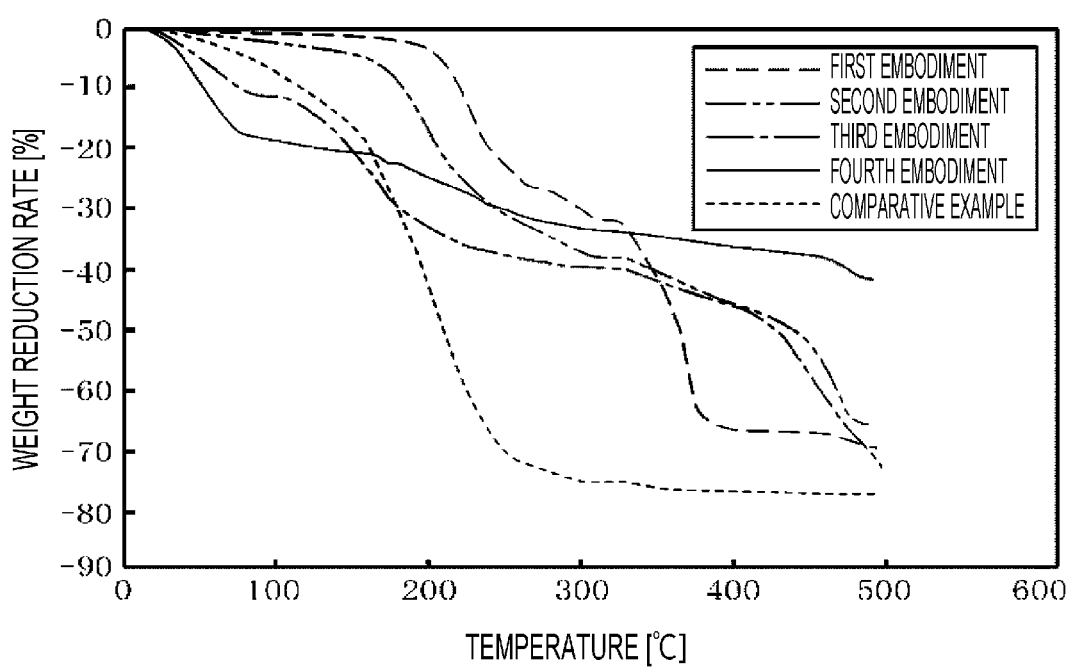
FIG. 10 is a characteristic diagram illustrating the results of an evaluation test of the porous member.

The results of the evaluation test are illustrated in FIG. 10. In FIG. 10, the horizontal axis indicates the temperature and the vertical axis indicates the weight reduction rate. Further, the results are indicated by a coarse broken line in the first embodiment, a two-dot chain line in the second embodiment, a one-dot chain line in the third embodiment, a solid line in the fourth embodiment, and a fine broken line in the comparative example. As a result, in all of the first to fourth embodiments, it was confirmed that the weight reduction rate increased as the temperature increased, $AlCl_3$ was adsorbed on the metal-organic framework, and the adsorbed $AlCl_3$ was desorbed by heating the metal-organic framework 3.

Further, since the method of changing the weight reduction rate differs according to the type of the metal-organic framework, it was understood that the size of the pores and the ease of adsorbing $AlCl_3$ differ according to the metal-organic framework. From this, it is presumed that the metal-organic framework has a high degree of freedom in designing the size of pores, and that an appropriate metal-organic framework may be designed and manufactured according to the gas to be adsorbed.

In the case of $AlCl_3$ alone, which is a comparative example, it was confirmed that the weight reduction rate increased sharply at a temperature of 125° C. or higher and vaporization was progressing. Meanwhile, in the third and fourth embodiments, the increase in the weight reduction rate was observed at a temperature lower than 125° C. From this, it was confirmed that when the metal-organic frameworks of the third and fourth embodiments are used, $AlCl_3$ may be desorbed at a temperature lower than 125° C., for example, about 80° C. to 90° C. Thus, it is understood that when $AlCl_3$ is used as a raw material, the metal-organic frameworks of the third and fourth embodiments may be used as the porous member 211. Further, in the metal-organic frameworks of the first and second embodiments, adsorption and desorption of $AlCl_3$ to the metal-organic frameworks were also confirmed. From this, it may be seen that when there are metal halides other than $AlCl_3$ that may be desorbed at a lower temperature, organometallic compounds, or organic compounds, it may be used for preferentially adsorbing these substances.

DESCRIPTION OF SYMBOLS

A: molecule
W: wafer
1: film forming apparatus
21: raw material cartridge
211: porous member
220: desorption mechanism
22: main body

What is claimed is:
1. A substrate processing apparatus comprising:
a chamber configured to accommodate a substrate; and
a processing gas supply connected to the chamber via a flow path and configured to supply a processing gas for processing the substrate,
wherein the processing gas supply includes:
a raw material cartridge including a raw material tank that accommodates a porous member containing a metal-organic framework adsorbed with gas molecules of a raw material of the processing gas, the metal-organic framework having a structure in which nanometer-sized pores are regularly and three-dimensionally arranged;
a main body including a container portion configured to allow the raw material cartridge to be installed thereon or removed therefrom and a cover portion that is connected to the flow path to communicate the raw material tank and the flow path with each other and closes an opening of the container portion when the raw material cartridge is installed; and
a desorber configured to desorb the gas molecules of the raw material of the processing gas adsorbed onto the metal-organic framework and allow the gas molecules to flow out as the processing gas to the flow path while the raw material cartridge is installed on the main body, and
wherein the raw material cartridge further includes a short pipe portion provided on an upper surface of the raw material tank and connected to the cover portion, and when the raw material cartridge is installed to the main body, the short pipe portion is connected to the flow path.
2. The substrate processing apparatus according to claim 1, wherein the raw material of the processing gas is a liquid or solid substance at normal temperature and normal pressure.

3. The substrate processing apparatus according to claim 1, wherein the desorber includes a porous member heater configured to heat the porous member in a raw material tank to desorb the gas molecules of the raw material of the processing gas.

4. The substrate processing apparatus according to claim 1, wherein the metal-organic framework is selected from the group consisting of metal-organic frameworks described in (a) to (c) below:
   (a) a metal-organic framework having a pore structure formed by accumulating a plurality of metal complexes each composed of a coordinate bond between an iron ion and 1,3,5-benzenetricarboxylic acid;
   (b) a metal-organic framework having a pore structure formed by accumulating a plurality of metal complexes each composed of a coordinate bond between a chromium ion and terephthalic acid; and
   (c) a metal-organic framework having a pore structure formed by accumulating a plurality of metal complexes each composed of a coordinate bond between a lanthanum ion and 1,3,5-tris(4-carboxyphenyl)benzene.

5. The substrate processing apparatus according to claim 1, wherein the flow path includes a flow rate regulator configured to regulate a flow rate of the processing gas.

6. The substrate processing apparatus according to claim 1, wherein the substrate processing apparatus is configured to supply the processing gas so as to form a film on the substrate, and the raw material of the processing gas is a metal halide.

7. The substrate processing apparatus according to claim 6, wherein the metal halide is selected from the metal halide group consisting of aluminum chloride, tungsten pentoxide, and titanium tetrachloride.

8. The substrate processing apparatus according to claim 6, further comprising:
   a processing gas supply stop valve provided in the flow path and configured to supply and stop supplying the processing gas to the chamber;
   a reaction gas supply configured to supply a reaction gas that reacts with the processing gas to form the film and including a reaction gas supply stop valve configured to supply and stop supplying the reaction gas to the chamber; and
   a controller,
   wherein the controller is configured to control the processing gas supply stop valve and the reaction gas supply stop valve such that the processing gas and the reaction gas are alternately supplied to the chamber.

9. The substrate processing apparatus according to claim 1, wherein with respect to the metal-organic framework, the raw material of the processing gas is adsorbed so that one or more gas molecules of the raw material enter each of the nanometer-sized pores.

10. A raw material cartridge installed on a substrate processing apparatus for manufacturing a semiconductor device and configured to supply a processing gas for processing the substrate, the raw material cartridge comprising:
   a raw material tank that accommodates a porous member containing a metal-organic framework adsorbed with gas molecules of a raw material of the processing gas, the metal-organic framework having a structure in which nanometer-sized pores are regularly and three-dimensionally arranged,
   wherein the raw material cartridge is configured to perform a desorption operation, thereby desorbing the gas molecules of the raw material of the processing gas adsorbed onto the metal-organic framework and supplying a raw material gas of a film, and
   the metal-organic framework is selected from the group consisting of metal-organic frameworks described in (a) to (c) below:
   (a) a metal-organic framework having a pore structure formed by accumulating a plurality of metal complexes each composed of a coordinate bond between an iron ion and 1,3,5-benzenetricarboxylic acid;
   (b) a metal-organic framework having a pore structure formed by accumulating a plurality of metal complexes each composed of a coordinate bond between a chromium ion and terephthalic acid; and
   (c) a metal-organic framework having a pore structure formed by accumulating a plurality of metal complexes each composed of a coordinate bond between a lanthanum ion and 1,3,5-tris(4-carboxyphenyl)benzene.

11. The raw material cartridge according to claim 10, wherein the raw material of the processing gas is a liquid or solid substance at normal temperature and normal pressure.

12. The raw material cartridge according to claim 10, wherein the desorption operation is an operation of heating the porous member in the raw material tank and desorbing the gas molecules of the raw material of the processing gas.

13. A substrate processing method comprising:
   installing a raw material cartridge including a raw material tank that accommodates a porous member containing a metal-organic framework in which gas molecules of a raw material of a processing gas for processing a substrate are adsorbed onto a container portion of a main body of a processing gas supply, the metal-organic framework having a structure in which nanometer-sized pores are regularly and three-dimensionally arranged, and the container portion being configured to allow the raw material cartridge to be installed thereon or removed therefrom;
   closing an opening of the container portion with a cover portion of the main body, the cover portion being connected to a flow path connected to a chamber of a substrate processing apparatus to communicate the raw material tank and the flow path with each other;
   desorbing the gas molecules of the raw material of the processing gas adsorbed onto the metal-organic framework in the processing gas supply, thereby obtaining the processing gas; and
   supplying the processing gas to a chamber in which the substrate is accommodated,
   wherein the raw material cartridge further includes a short pipe portion provided on an upper surface of the raw material tank and connected to the cover portion, and
   when the raw material cartridge is installed to the main body, the short pipe portion is connected to the flow path.

14. The substrate processing method according to claim 13, wherein the raw material of the processing gas is a liquid or solid substance at normal temperature and normal pressure.

15. The substrate processing method according to claim 13, wherein in the obtaining the processing gas, the porous member in the raw material tank is heated to desorb the gas molecules of the raw material of the processing gas.

16. The substrate processing method according to claim 13, wherein the metal-organic framework is selected from the group consisting of metal-organic frameworks described in (a) to (c) below:
   (a) a metal-organic framework having a pore structure formed by accumulating a plurality of metal complexes each composed of a coordinate bond between an iron ion and 1,3,5-benzenetricarboxylic acid;

(b) a metal-organic framework having a pore structure formed by accumulating a plurality of metal complexes each composed of a coordinate bond between a chromium ion and terephthalic acid; and (c) a metal-organic framework having a pore structure formed by accumulating a plurality of metal complexes each composed of a coordinate bond between a lanthanum ion and 1,3,5-tris(4-carboxyphenyl)benzene.

17. The substrate processing method according to claim 13, wherein the supplying the processing gas forms a film on the substrate and the raw material of the processing gas is a metal halide.

18. The substrate processing method according to claim 17, wherein the metal halide is selected from the metal halide group consisting of aluminum chloride, tungsten pentoxide, and titanium tetrachloride.

19. A method of manufacturing a raw material cartridge that is installed on a substrate processing apparatus for manufacturing a semiconductor device and is configured to supply a processing gas for processing the substrate, the method comprising:

supplying gas molecules of a raw material of the processing gas to a metal-organic framework contained in a porous member accommodated in a raw material tank constituting the raw material cartridge, thereby adsorbing the gas molecules, the metal-organic framework having a structure in which nanometer-sized pores are regularly and three-dimensionally arranged, wherein the metal-organic framework is selected from the group consisting of metal-organic frameworks described in (a) to (c) below:

(a) a metal-organic framework having a pore structure formed by accumulating a plurality of metal complexes each composed of a coordinate bond between an iron ion and 1,3,5-benzenetricarboxylic acid;

(b) a metal-organic framework having a pore structure formed by accumulating a plurality of metal complexes each composed of a coordinate bond between a chromium ion and terephthalic acid; and (c) a metal-organic framework having a pore structure formed by accumulating a plurality of metal complexes each composed of a coordinate bond between a lanthanum ion and 1,3,5-tris(4-carboxyphenyl)benzene.

20. The method according to claim 19, wherein the raw material of the processing gas is a liquid or solid substance at normal temperature and normal pressure.

* * * * *